United States Patent [19]

Harder et al.

[11] Patent Number: 5,545,457
[45] Date of Patent: Aug. 13, 1996

[54] SELF-ADHESIVE LIDDING FILM FOR PACKAGING ELECTRONIC COMPONENTS

[75] Inventors: Christian Harder, Hamburg; Bernd Höwe, Schenefeld; Karl Kuhlmann, Hamburg, all of Germany

[73] Assignee: Beiersdorf Aktiengesellschaft, Hamburg, Germany

[21] Appl. No.: 201,585

[22] Filed: Feb. 25, 1994

[30] Foreign Application Priority Data

Feb. 26, 1993 [DE] Germany .......................... 43 05 910.4

[51] Int. Cl.$^6$ .............................. B65D 73/02; B32B 7/12; B32B 27/08; C08L 33/02
[52] U.S. Cl. ........................... 428/77; 428/345; 428/353; 428/354; 428/355; 428/483; 428/189; 524/522; 524/523; 526/221; 526/222
[58] Field of Search ..................................... 428/192, 345, 428/353, 354, 355, 77, 78, 189, 480, 483, 516; 525/221, 222, 227; 524/522, 523

[56] References Cited

U.S. PATENT DOCUMENTS

| | | | |
|---|---|---|---|
| 3,725,115 | 4/1973 | Christenson et al. | 117/93.31 |
| 4,054,232 | 10/1977 | Cawley | 222/107 |
| 4,413,073 | 11/1983 | Gibson et al. | 523/511 |
| 4,421,822 | 12/1983 | Levens | 428/343 |
| 4,513,039 | 4/1985 | Esmay | 428/40 |
| 4,569,960 | 2/1986 | Blake | 524/145 |
| 4,912,169 | 3/1990 | Whitmire et al. | 525/221 |
| 4,929,486 | 5/1990 | Itou et al. | 428/77 |
| 4,963,405 | 10/1990 | Yamashita et al. | 428/40 |
| 4,994,300 | 2/1991 | Itou et al. | 427/54.1 |
| 5,035,933 | 7/1991 | Ilenda et al. | 428/36.6 |
| 5,149,586 | 9/1992 | Ishiwata et al. | 428/345 |
| 5,164,441 | 11/1992 | Yang | 524/458 |
| 5,252,694 | 10/1993 | Willett et al. | 524/404 |

FOREIGN PATENT DOCUMENTS

| | | |
|---|---|---|
| 0051168 | 10/1981 | European Pat. Off. . |
| 00511685 | 5/1982 | European Pat. Off. . |
| 0300838 | 1/1989 | European Pat. Off. . |
| 3530581 | 3/1986 | Germany . |
| 3928712 | 3/1990 | Germany . |
| 3928713 | 3/1990 | Germany . |
| 9114461 | 10/1991 | WIPO . |

OTHER PUBLICATIONS

European Patent Office, Database WPI, Week 8133, Derwent Publications; An 81–59576D & JP–A–56079112, "Non-aq. resin dispersion mfr. . . . ", Ricoh KK.

Primary Examiner—Paul Thibodeau
Assistant Examiner—Vivian Chen
Attorney, Agent, or Firm—Sprung Horn Kramer & Woods

[57] ABSTRACT

Self-adhesive lidding film for packaging electronic components, whose adhesive layer is covered with a non-adhesive covering in the center, wherein the adhesive layer comprises a mixture of two acrylate adhesive compositions of different polarity, the first, highly polar component containing from 1 to 20%, in particular from 6 to 10%, especially about 8%, of acrylic acid in the monomer composition, and the other, nonpolar component containing from 5 to 50%, in particular from 10 to 30%, especially about 20%, of stearyl acrylate in the monomer composition, and where an adhesion promoter or primer is present between the adhesive layer and the film support of the lidding film.

13 Claims, No Drawings

SELF-ADHESIVE LIDDING FILM FOR PACKAGING ELECTRONIC COMPONENTS

BACKGROUND OF THE INVENTION

1. Field of the Invention

The invention relates to a self-adhesive lidding film for packaging electronic components and to the use of packages lidded in this way, in particular in high-speed automatic machines.

2. Description of the Prior Art

Electronic components, in particular micro-electronic components, are packaged in thermoformed caverns of thermoplastic sheeting, such as, for example, in sheeting made from polyvinyl chloride (PVC), polystyrene (PS) or polycarbonate (PC), these plastics being processed either in pure form or filled with carbon black. These so-called belts have for many years been sealed with lidding films by means of hot-melt adhesives and processed in automatic machines, i.e. opened and the components packaged in them removed.

However, there are also already self-adhesive lidding films for such applications whose adhesive layer has been deactivated in the centre by means of a conductive or nonconductive plastic film. This deactivating strip covers the openings of the support belt so that the components do not come into contact with the self-adhesive layer. The adhesive strips with widths of 0.5 to 1.2 mm remaining at the two edges of the sealing sheet bond the latter to the support belt. A sufficient adhesive force here is regarded as being a peel-off force of the sealing sheet from the support belt in the range 20–100 cN.

Lidding films of this type have been described in the prior art and are also commercially available, for example as "cover tape YR 2666" from 3M. In addition, products of this type are described in Siemens Patent EP 51 168, and also in DE-A 39 28 712, DE-A 39 28 713 and EP-A 300 838.

However, the products of the prior art have disadvantages which are particularly noticeable in practice. For example, packages of this type containing electronic components are employed in high-speed automatic machines in which the slightest disturbances or unevenness has consequences for the entire process in which the use of a package lidded in this way has been integrated. Thus, for example, lidding films which adhere nonuniformly can result in problems as a consequence of differing polarities of the various materials employed, and the lidding film must therefore adhere equally well to various packaging belts, and must do so immediately and with sufficient strength. In addition, peeling-off of the lidding film in a high-speed automatic machine of this type must not, for example, result in adhesive residues on the packaging belt, since such residues can build up and accumulate, although perhaps only in very small amounts at individual point, but in the overall process giving interfering amounts at individual machine parts and then interfere with the process. Any residue of adhesive compositions must therefore be avoided, in particular after exposure of the lidded package to moisture and heat, as required by many belt processors, for example in the IEC 68-2-3 tropics test.

The object of the invention was to provide a remedy here and to avoid the disadvantages of products of the prior art, but at least to reduce them to an extent acceptable for industry.

SUMMARY OF THE INVENTION

Accordingly, the invention relates to self-adhesive lidding film and to the use thereof as characterized in greater detail in the patent claims.

In the manner known per se, the pressure-sensitive adhesives employed here are copolymers based on various acrylate compounds, such as acrylic acid, butyl acrylate, methylhexyl acrylate and stearyl acrylate, since this group of adhesives generally has very good heat and ageing resistance. However, in order to meet the particular requirements in the present case due to the variety of substrates to be bonded, a particular mixture of acrylate adhesive compositions is employed according to the invention, namely firstly a highly polar component and secondly a rather nonpolar component. This results in simple, rapid and durable bonding to a very wide variety of belt tapes, as employed in practice. Together with the adhesion promoter used, this results in fault-free use of the packages sealed according to the invention in high-speed automatic machines without interfering residues of adhesive composition hindering the process and without interfering unevenness in the peel-off behaviour resulting in vibrations building up.

Advantageously, the highly polar component contains from 1 to about 20%, in particular from 6 to 10%, especially about 8%, of acrylic acid in the monomer composition, and the other relatively, nonpolar component contains from 5 to 50%, in particular from 10 to 30%, especially about 20%, of stearyl acrylate in the monomer composition. Advantageously an adhesion promoter (primer) is present between the adhesive layer and the film support of the lidding film.

DESCRIPTION OF THE PREFERRED EMBODIMENTS

A particularly suitable adhesion promoter is one of the reactive acrylate copolymer type with an epoxy curing agent.

A particularly suitable support for the lidding film is a polyester film, in thicknesses of from 0.015 to 0.050 mm.

The invention is described below with reference to examples, although these do not represent a limitation. Percentages are % by weight, parts are parts by weight.

EXAMPLE

A polyester film of the Hostaphan RN type from Hoechst in a thickness of 0.025 mm is coated with an adhesion promoter based on an acrylate copolymer. The acrylate copolymer employed is a 46% strength dispersion from ICI containing NeoTac A-570 and, as curing agent, the water-dispersible epoxy resin Epi-Rez WD-510 from Interez Inc. The two substances react at room temperature to give a film which is insoluble in MEK, acetone and isopropanol and has a softening point of above 190° C. The NeoTac A-570:Epi-Rez WD-510 mixing ratio is 88.5:11.5.

The application is carried out by means of a wire knife coater from a 10% strength dispersion, application rate 0.3 g/m$^2$.

The self-adhesive composition coating is applied from 40% strength solution at a rate of 42 g/m$^2$. The self-adhesive composition applied comprises 80 parts of an acrylate copolymer containing 9% of acrylic acid and 20 parts of an acrylate copolymer containing 20% of stearyl acrylate.

The finished adhesive tape is exposed on the composition side to electron beam irradiation (210 kV irradiation voltage and a dose of 40 kGy) in order to achieve the desired property profile of the adhesive composition.

We claim:

1. A self-adhesive lidding film for packaging electronic components, comprising
   (a) a thermoplastic film
   (b) an adhesion promoter on one side of the thermoplastic film,
   (c) an adhesive layer on the adhesion promoter, and
   (d) a nonadhesive covering spaced from the edges of said adhesive layer, the adhesive layer (c) comprising a mixture of 80 parts by weight of a first acrylate polymer and about 20 parts by weight of a second acrylate polymer adhesive of different polarity from said first, said first acrylate polymer adhesive being polar and containing from about 1 to 20% by weight of acrylic acid monomer, the second acrylate polymer adhesive being substantially non-polar and containing from about 5 to 50% by weight of stearyl acrylate monomer.

2. A lidding film according to claim 1, wherein the covering (d) is a plastic film.

3. A lidding film according to claim 1, wherein the film (a) is a polyester.

4. A lidding film according to claim 1, wherein adhesion promoter (b) comprises an acrylic copolymer and an epoxy curing agent.

5. A lidding film according to claim 1, wherein the epoxy curing agent comprises bis-phenol A.

6. A lidding film according to claim 5, wherein the weight ratio between the acrylic copolymer and the epoxy curing agent is between about 95:5 and 80: 20.

7. A lidding film according to claim 5, wherein the weight ratio between the acrylic copolymer and the epoxy curing agent is about 88.5:11.5.

8. A lidding film according to claim 4, wherein adhesion promoter (b) comprises about 88.5 parts by weight of an acrylic copolymer and 11.5 parts by weight of the epoxy curing agent which is bis-phenol A, and wherein adhesive layer (c) has been exposed to electron irradiation, and covering (d) is a plastic film.

9. A lidding film according to claim 8, wherein the film (a) is a polyester, and in adhesive layer (c) said first acrylate polymer adhesive contains about 8% of acrylic acid and said second acrylate polymer adhesive contains about 20% of stearyl acrylate.

10. In the sealing of electronic components in lidding films on high-speed automatic machines, the improvement which comprises employing as said lidding film a lidding film according to claim 8.

11. A lidding film according to claim 1, wherein adhesive layer (c) has been exposed to electron irradiation.

12. In the sealing of electronic components in lidding films on high-speed automatic machines, the improvement which comprises employing as said lidding film a lidding film according to claim 1.

13. A lidding film according to claim 1, wherein in adhesive layer (c) said first acrylate polymer adhesive contains from about 6 to 10% of acrylic acid and said second acrylate polymer adhesive containing from about 10 to 30% of stearyl acrylate.

* * * * *

UNITED STATES PATENT AND TRADEMARK OFFICE
CERTIFICATE OF CORRECTION

PATENT NO. : 5,545,457
DATED : August 13, 1996
INVENTOR(S) : Harder, et al.

It is certified that error appears in the above-identified patent and that said Letters Patent is hereby corrected as shown below:

On the title page:

Item [56]  FOREIGN PATENT DOCUMENTS: Delete " 00511685 " and substitute -- 0051168 --

Col. 3, claim 1 line 10   After " polymer " insert -- adhesive --

Signed and Sealed this

First Day of April, 1997

BRUCE LEHMAN

Commissioner of Patents and Trademarks

Attest:

Attesting Officer